United States Patent [19]

Olla et al.

[11] Patent Number: 4,743,956

[45] Date of Patent: May 10, 1988

[54] OFFSET BENDING OF CURVACEOUSLY PLANAR RADIATING LEADFRAME LEADS IN SEMICONDUCTOR CHIP PACKAGING

[75] Inventors: Michael A. Olla, Denton; Linn C. Garrison, Dallas; Robert H. Bond, Denton; Harold Trammell, Tarrant, all of Tex.

[73] Assignee: Thomson Components-Mostek Corporation, Carrollton, Tex.

[21] Appl. No.: 941,691

[22] Filed: Dec. 15, 1986

[51] Int. Cl.$^4$ .............................. C23F 1/02; B44C 1/22; H01L 23/48; H01L 29/44

[52] U.S. Cl. ..................................... 357/70; 156/634; 156/645; 156/656; 156/901; 428/573; 428/596; 437/220

[58] Field of Search ...................... 29/576 S, 591, 827; 174/68.5; 357/70; 339/278 M; 428/131, 573, 596, 601, 602; 156/629, 634, 645, 654, 656, 659.1, 661.1, 901; 437/220

[56] References Cited

U.S. PATENT DOCUMENTS 3,736,367 5/1973 Heinlen et al. ................ 357/70 X
4,026,008 5/1977 Drees et al. ................... 357/70 X

*Primary Examiner*—William A. Powell
*Attorney, Agent, or Firm*—Roland Plottel; Richard Roberts

[57] ABSTRACT

A method of forming leadframes for use in manufacturing semiconductor chips starts with fabricating a plurality of leadframes by metal stamping or etching leadframe patterns into a flat ribbon of conductive material. The leadframe patterns include a plurality of outwardly radiating leads, inner radiating leads, and a central perimeter for interconnecting the outwardly and inner radiating leads. The outwardly radiating leads are arranged in groups, each of which are directed along planar perpedicular coordinates. The inner radiating leads have 180 degrees turns in the plane of the leadframe. The inner radiating leads are then successively bent at an acute angle and parallel to the plane of said leadframe so that the inner radiating leads are offset from the plane of the leadframe. The bending is performed in such a manner that each of the leads are formed with a stable spring force for effective bonding to corresponding semiconductor chip pads.

4 Claims, 2 Drawing Sheets

OFFSET BENDING OF CURVACEOUSLY PLANAR RADIATING LEADFRAME LEADS IN SEMICONDUCTOR CHIP PACKAGING

DESCRIPTION

1. Technical Field

The invention addressed herein falls within the technical field of manufacturing integrated circuit semiconductor chips and in particular the preparation of leadframes for bonding connection with pads of the chips themselves.

2. Background Art

In the last stages of semiconductor chip assembly the chips are bonded to a leadframe, wires are bonded to each lead in the leadframe, the chip and a portion of the leadframe are molded in a plastic package, adjacent plastic packages are cut apart, and excess plastic and residue material from each chip package is trimmed away.

The manufacture of integrated circuits is a long and arduous process which includes preparing a silicon wafer containing several hundred or more integrated circuit chips; testing the chips individually to determine which are working and which are not; cutting the chips in the water apart from one another; attaching the successfully tested chips to respective leadframes; bonding electric wires to the leads of the leadframe one at a time; encapsulating each of the chips in a plastic or ceramic package to provide protection for the device; and respective cutting, trimming and forming the external parts of the leadframe into their final shape.

Formerly, wires were typically attached to a semiconductor chip by direct wire bonding techniques. This involves a method by which a gold or aluminum alloy wire is pressed very hard under high temperature conditions and/or with the introduction of high level ultrasonic energy against conductive pads on the chip until a bond is formed. One wire is bonded at a time, according to this method. This method unfortunately consumes a great deal of labor and expensive materials.

Automated wire bonding machines are known, but they have an inherent limitation. Even with the most rapid machines that can be imagined, there are factors that provide a necessary limitation to the number of wire bonds that can be made per hour.

According to typical wire bonding techniques, it is also necessary to attach the chip firmly to the package or leadframe in order to maintain it in position while the required bonds are formed. Also, the leads in this process are made of an expensive expansion-controlled alloy in order to have the correct thermal expansion matching between the chip and the leads, or alternatively expensive special adhesives must be used to compensate for thermal mismatch. Further, the leads are plated with gold, silver or similar precious metal, so that the bonding wire can establish a reliable connection to the lead.

To simply reduce the costs and contribute toward the continued development of automated manufacturing techniques in the connection of semiconductor chips to external electric leads, sophisticated new leadframe technologies have been developed. According to this technology, leadframes are made of a thin, strip or sheet of metal which is etched or stamped into a predetermined shape for connection with a selected chip design. A single leadframe strip or assembly can comprise leadframes for any of a predetermined number of chips. The total leadframe strip is essentially flat, and after encapsulation in plastic, portions of the leadframe extend out of the respective chip packages. In particular, the leadframe extends out of the sides of the packages at a defined selected elevation which is determined in advance. These outwardly extending portions include the ends of the leads of a package. These leads may be ultimately bent for insertion into a suitable connector device.

In effect, the leadframe can be considered to include a predetermined number of adjacent leadframe portions, which are aligned along the length of the leadframe. Each leadframe portion includes a perimeter (dambar) defining the end of the inner and the beginning of the outer leads of the leadframe.

The inner tips of each leadframe, moreover, are designed to connect electrically with the contact pads of a semiconductor chip. The chips themselves in some cases are provided with a dielectric polymide layer. So-called conductor vias lead through this dielectric layer to engage corresponding metallic contacts within the chip itself.

In this manner, the establishment of a predetermined array or pattern of contact pads to join the inner ends of the leadframe is enabled for all kinds of chips irrespective of size or the number of leads or contacts required.

One variable consideration in the shape of the leadframe is the elevation of the top surface of a chip to be bonded to the leadframe. This affects the shape of the leadframe and the level of its exit from the package. This exit level is typically standardized for comparable chip products.

SUMMARY OF THE INVENTION

According to the invention, leadframes including a predetermined number of planar curvaceously outwardly radiating leads are formed to define offset bends before packaging in plastic. In particular, formation is accomplished at specifically outwardly-oriented portions of the inner leads within the perimeter of said leadframe, whereby a pre-established, consistently-determinable, spring-force at the center of said leadframe is established.

More particularly, formation effects an offset within the perimeter of the leadframe. This offset is to be accomplished by a bend established in conjunction with an adjacent straightening bend for each inner lead of the leadframe.

DETAILED DESCRIPTION OF A PREFERRED VERSION OR BEST MODE OF THE INVENTION

Figure 1:
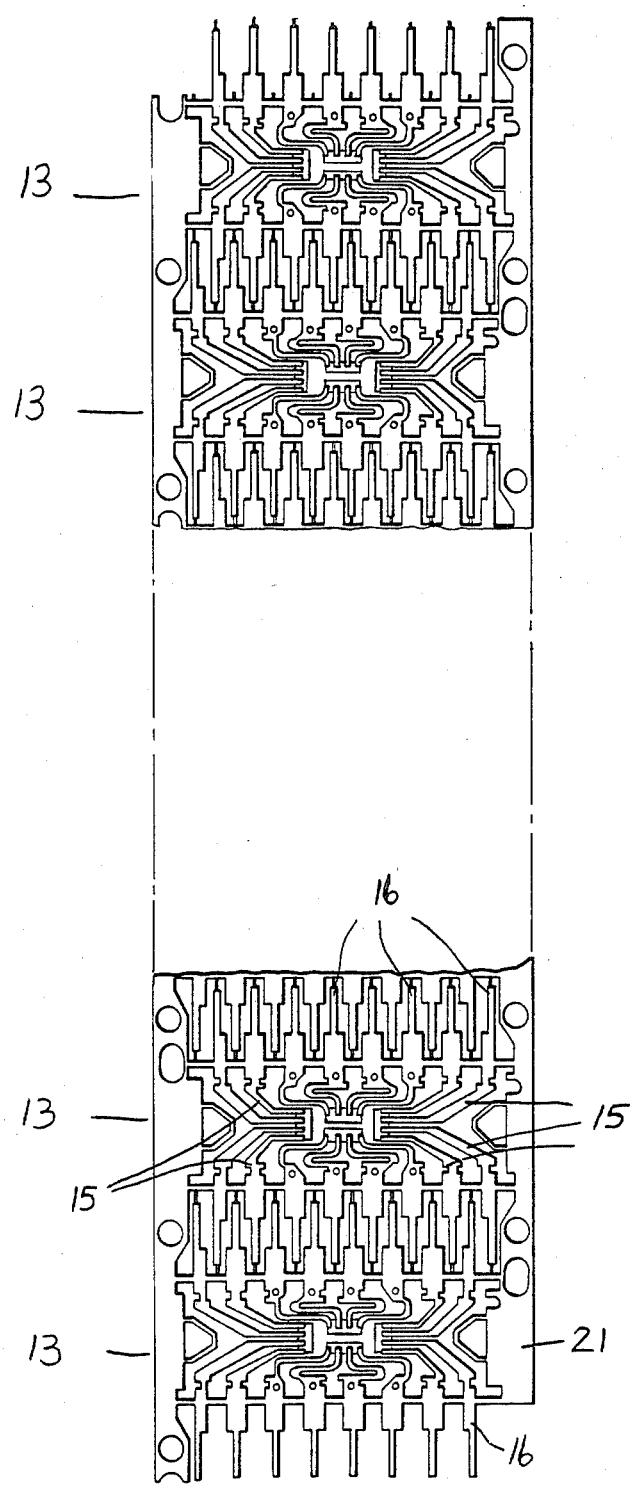
FIG. 1 is a plan view illustrating a strip of leadframes prior to separation from the strip.

FIG. 1 shows a leadframe strip including a plurality of individual leadframes 13 along the length of the strip. These leadframes 13 are established in a blank strip of flat conductive metal by stamping or etching according to well-known metal working techniques.

The leadframe 13 includes inner and outer leads, respectively 15 and 16, and a central perimeter. Each of the inner leads 15 corresponds to one of the outer leads 16. Certain parts of the leadframe are ultimately trimmed away during manufacture.

For example, sections of the outer perimeter 21 of each leadframe 13 are cut away during so-called trim and form operation during the last stages of manufacture, after molding operation has taken place.

Figure 2:
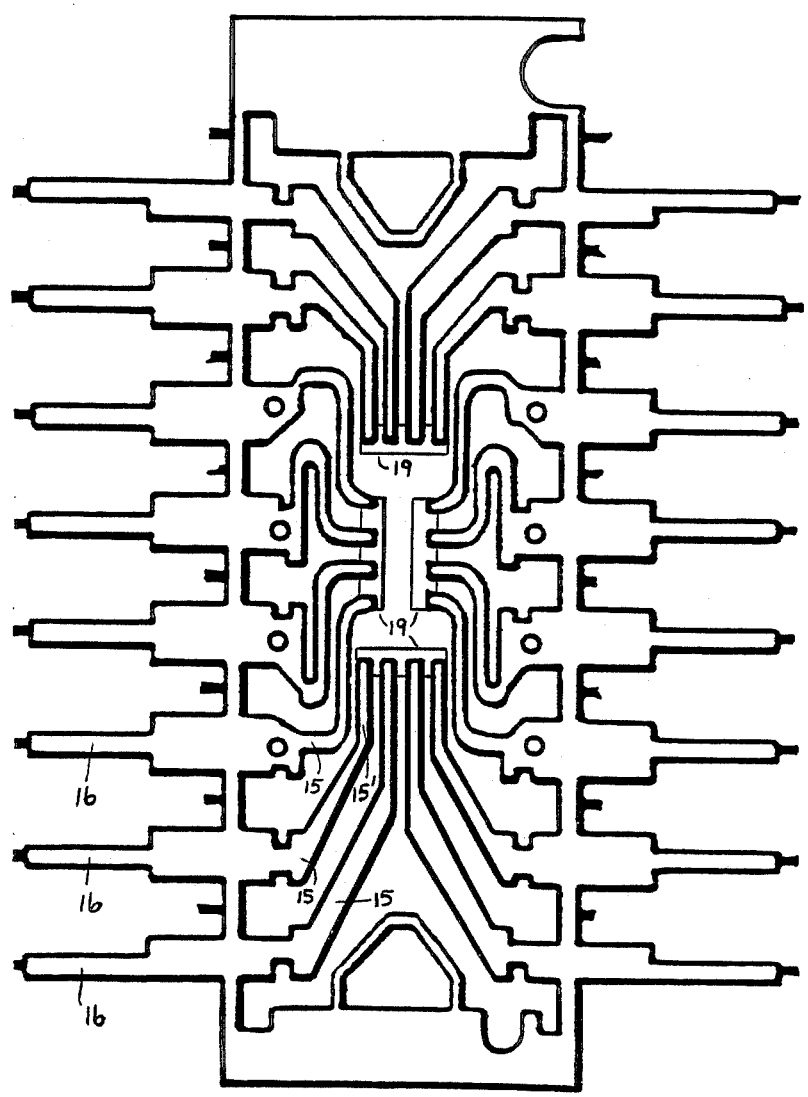
FIG. 2 is an enlarged plan view of a single leadframe after separation from the strip.

Furthermore, in FIG. 2, the inner tips 15' of the inner leads 15 are initially connected with tie pieces 19 at their inner ends. Before the end of the inner tips 15' can be bonded to a selected semiconductor chip, these tie pieces 19 must be cut away.

Whereas the shape of the outer leads is straight and regular, the inner leads are curvaceous and convuluted, even though the curves are all planar. Each of the inner leads in effect snakes from the perimeter of the leadframe toward its inner tip according to a predetermined pattern as shown in the FIG. 2, to establish a desired spring constant for bearing equally against the pad surfaces of a selected semiconductor chip during bonding operation.

The inner tips 15' are established to conform to a predetermined pad array pattern on the chip itself, which is relatively small in surface area. Accordingly, the inner tips are relatively close to one another, even though they expand substantially as they radiate outward from the center, through the perimeter and beyond.

The inner leads 15 which are connected to the corner regions of the perimeter accordingly have the greatest overall distance of extension, in comparison to the leads connecting the midsection of the perimeter. It follows that the character of the curves will be different for inner leads connected to the corners of the leadframe perimeter than for those inner leads otherwise connected.

Nonetheless, even though the lengths of some of the inner leads are greater than the others, the effective spring constant is desirably set to be the same.

As is apparent from FIG. 1, each of the inner leads includes both curved and straight portions. Many of the curved portions are in fact 180 degree bends; others are mere 90 degree bends.

If a bend is made in an upwardly directed lead about an axis perpendicular to its direction at a location of said upwardly directed lead which is in fact directly upwardly oriented, then the spring effect of the lead will not be degraded or destroyed.

Accordingly, for the leadframe shown in FIG. 1, leads are formed as indicated at the straight portion thereof on the interior of the leadframe perimeter. Other leads are formed at the 90 degree portions of the 180 degree bend. Further, each inner tip is formed to present a flat lead surface for contact with the pads of the chip.

Such forming or formation entails as to each inner lead a downward bend near the perimeter of the leadframe and an adjacent leveling bend immediately adjacent thereto.

It should be understood that the invention is not limited to the particular embodiments shown and described herein, but that various changes and modifications may be made without department from the spirit and scope of this novel concept as defined by the following claims.

What is claimed is:

1. A method of forming leadframes for use in manufacturing semiconductor chips; comprising the steps of fabricating a plurality of leadframes by metal stamping or etching leadframe patterns into a flat ribbon of conductive material, said leadframe patterns including a plurality of outwardly radiating leads, inner radiating leads, and a central perimeter for interconnecting said outwardly and inner radiating leads, said outwardly radiating leads being arranged in groups each of which are directed along planar perpendicular coordinates, arranging said inner radiating leads with turns in the plane of said leadframe, bending said inner radiating leads successively at an acute angle and parallel to the plane of said leadframe so that said inner radiating leads are offset from the plane of said leadframe, performing said bending in such a manner that each of said inner radiating leads is formed with a substantially equal spring constant for effective bonding to corresponding semiconductor chip pads and, wherein each of said bends is made at an acute angle to the direction of the lead and at a portion of said lead at which it is directed in the same direction as the lead as a whole.

2. The method according to claim 1 wherein said offset formation includes bending at a 90 degree portion of selected 180 degree turns of said leads.

3. A leadframe fabricated from a flat ribbon of conductive material and defining a pattern comprising a predetermined plurality of outwardly radiating leads and a central perimeter for interconnecting said leads, said outwardly radiating leads being in groups each directed along planar perpendicular coordinates and whereby, said inner leads including 180 degree turns in the plane of said leadframe, characterized in that successive adjacent bends and straightening bends are made in each of said leads within said perimeter, whereby said leads are offset bends with a predetermined substantially equal spring constant in each of said leads and whereby effective bonding to corresponding semiconductor chip pads and each bend is made at a lead perpendicular to the direction of the lead along planar coordinates and where the lead at which it is directed is the same direction as the lead as a whole.

4. The leadframe according to claim 3, further characterized in that offset formation includes bending at the ninety degree portion of selected 180 degree turns of said leads.

* * * * *